United States Patent
Hassoun et al.

[11] Patent Number: 5,844,913
[45] Date of Patent: Dec. 1, 1998

[54] CURRENT MODE INTERFACE CIRCUITRY FOR AN IC TEST DEVICE

[75] Inventors: Joseph Hani Hassoun, Pleasanton; James A. Gasbarro, Mountain View, both of Calif.

[73] Assignees: Hewlett-Packard Company, Palo Alto; Rambus, Inc., Mountain View, both of Calif.

[21] Appl. No.: 833,412

[22] Filed: Apr. 4, 1997

[51] Int. Cl.[6] .............................. G01R 31/28; A63B 49/00
[52] U.S. Cl. ...................... 371/21.1; 371/22.1; 371/27.1; 324/537
[58] Field of Search .................................. 371/21.1, 22.1, 371/27.1; 324/537, 765, 73.1; 365/201

[56] References Cited

U.S. PATENT DOCUMENTS

| | | | |
|---|---|---|---|
| 4,764,924 | 8/1988 | Mate | 371/22.1 |
| 4,862,460 | 8/1989 | Yamaguchi | 371/27 |
| 5,101,153 | 3/1992 | Morong, III | 324/537 |
| 5,250,854 | 10/1993 | Lien | 307/296.1 |
| 5,254,883 | 10/1993 | Horowitz et al. | 307/443 |
| 5,355,391 | 10/1994 | Horowitz et al. | 375/36 |
| 5,357,195 | 10/1994 | Gasbarro et al. | 324/158.1 |
| 5,363,382 | 11/1994 | Tsukakoshi | 371/21.2 |
| 5,498,990 | 3/1996 | Leung et al. | 327/323 |

*Primary Examiner*—Hoa T. Nguyen

[57] ABSTRACT

A test device for an integrated circuit utilizes current mode test signal shaping to evaluate circuit performance within at least one selected voltage swing. An interface circuit has an output line that is coupled to the integrated circuit under test. An upper voltage level ($V_{OH}$) is established by a connection of the output line to a voltage source. The connection to the source includes a resistor. Parallel switchable current paths to a voltage level significantly less than $V_{OH}$ are also formed from the output line. In the preferred embodiment, the current paths are MOS transistors to electrical ground. The transistors in an "on" state act as current sinks that create a greater voltage drop across the resistor. Consequently, there is a correspondence between the number of transistors that are switched by input of a test signal and the difference between $V_{OH}$ and $V_{OL}$. In the preferred embodiment, the interface circuit is used in the testing of a memory circuit, such as DRAM. Test sequences can be executed at different levels of $V_{OH}$ and $V_{OL}$, thereby ensuring that the integrated circuit under test will operate properly under different potential conditions.

22 Claims, 6 Drawing Sheets

CURRENT MODE INTERFACE CIRCUITRY FOR AN IC TEST DEVICE

DESCRIPTION

1. Technical Field

The invention relates generally to devices for testing integrated circuits and more particularly to interface circuitry for manipulating test signals conducted between an IC test device and an IC under test.

2. Background Art

Within the semiconductor industry, integrated circuit testing plays a significant role in maintaining an overall production quality standard. Ideally, the testing process accurately identifies defective devices without adversely affecting the ability to meet production throughput requirements and without significantly impacting the total production cost. However, the increasingly larger scale integration and the growing complexity of IC devices raise more difficulties in designing test equipment that provides both quality assurance and time/cost efficiency.

Test equipment for an IC device typically includes circuitry for parametric evaluation relating to threshold levels, supply voltages, loading, timing, and current. For example, U.S. Pat. No. 5,357,195 to Gasbarro et al. describes an apparatus for testing input and output parameters for high-speed integrated devices, such as dynamic random access memory (DRAM) devices. A data signal is coupled to a data pin of the IC under test, and transmit clock and receive clock signals are coupled to clock pins. The phase relation between signals can be adjusted to test input setup time ($t_{SU}$), input hold time ($t_H$), or clock-to-output time.

U.S. Pat. No. 5,363,382 to Tsukakoshi also describes test apparatus for detecting errors in a memory device. An algorithmic pattern generator (APG) generates address signals to select a memory cell of memory under test. After data have been written to a selected memory cell by address signals, the data are read and the read data are compared to data from the APG. If the data are not in agreement, the memory cell is determined to be faulty.

One concern with many known testers for testing high-speed memory devices is that the processing requires a "two-pass" approach. In a first pass, the core memory cells are evaluated on a low-speed memory device. High-speed bus interface logic is then tested using a high-speed test device. This two-pass approach is less cost efficient and time efficient than a testing process that would require only one tester-to-circuit connection.

Another concern relates to the testing of ICs at different voltages. Integrated circuitry should be able to operate equally effectively within a range of voltages. For example, two identical ICs may be installed into different devices, with one device having a high level bus rail of 3.5 volts and the other device having a high level bus rail of 5 volts. To ensure that ICs will operate properly at both the 3.5-volt rail level and the 5-volt rail level, the circuits should be tested at both levels. FIG. 1 illustrates a prior art circuit for inputting a data signal to an input/output pin of a device under test (DUT). The input signal is received along a line 10 connected to a pre-driver 12. An upper voltage limit ($V_{OH}$) is established by connection to a first digital-to-analog converter (DAC) 14. The lower voltage limit ($V_{OL}$) is established by connection to a second DAC 16. The pre-driver 12 controls a pull-up transistor 18 and a pull-down transistor 20. The output signal through a resistor 22 will vary with the input signal, but within a voltage swing determined by the first and second DACs 14 and 16. While the circuit operates well for its intended purpose, the circuitry requires a large amount of board real estate. Each connection to the DUT requires the pre-driver, the pull-up transistor 18, and the pull-down transistor 20. Conventionally, the transistors are bipolar transistors. Because of the real estate requirements, test pattern generation is conventionally performed at one integrated circuit, such as a logic complementary metal-oxide semiconductor (CMOS) circuit, that passes the pattern through a driver integrated circuit that shapes the waveform to the desired levels. The driver integrated circuit includes one or more of the interface circuits shown in FIG. 1. Signals that are received from the DUT are passed through a comparator integrated circuit that detects the voltage levels and evaluates the DUT. Thus, there are three separate integrated circuit devices that must be interconnected, again increasing space requirements.

What is needed is interface circuitry for coupling test signals between a test device and an integrated circuit, with the interface circuitry enabling test signal shaping to desired voltage levels in a space-efficient manner. What is further needed is a method of inputting the test signal utilizing the interface circuitry.

SUMMARY OF THE INVENTION

Interface circuitry of a test device for an integrated circuit utilizes current mode test signal shaping within a selected voltage swing, rather than voltage mode signal shaping. The test device includes an array of interface circuits for connection to a corresponding array of input/output lines of the device under test (DUT). The output line of an interface circuit is coupled to a number of current paths, with each current path having an "on" state and an "off" state. In the preferred embodiment, each switchable current path is a connection of a MOS transistor to a fixed low voltage, such as electrical ground. In addition to the parallel current paths, the output line has either an active or a resistive connection to a source of an upper voltage level.

Logic circuitry is coupled to the switchable current paths from the output line of the interface circuit. In the preferred embodiment in which the current paths are transistors, the logic circuitry is connected to individually and selectively turn the transistors "on" and "off." A transistor in an "on" state acts as a current sink that creates a greater voltage drop across the resistive connection to the source of the upper voltage level. Consequently, the lower voltage level of the interface circuit is dependent upon the distribution of transistors in "on" and "off" states.

The logic circuitry for the current paths of an interface circuit includes first and second inputs that co-operate to switch the current paths between the "on" states and the "off" states. For example, an AND logic function may be defined by the logic circuitry for each current path. The first input may be from a current controller that allows the current paths to be addressed individually. That is, in the preferred embodiment in which current paths are formed by MOS transistors, the first input determines the distribution of transistors that are turned "on" to the transistors that are turned "off" in response to logical switches of a test signal. The second input is connected to a source of the test signal and is common to all of the transistors. The AND logic functions for the various transistors couple the test signal to the output line with an upper voltage limit determined by the source and a lower voltage limit determined by the "on" and "off" distribution of transistor states.

In the preferred embodiment, the test device having the array of interface circuits is connected to a memory device.

In a more preferred embodiment, the memory device is a dynamic random access memory (DRAM) device. The test signal may be the output of an algorithmic pattern generator. The test device provides clock signals and data/address/control signals to the DUT in order to properly test the device.

An advantage of the invention is that the implementation of an output driver using current mode test signal shaping allows the test device to utilize components requiring less circuit board real estate than many prior art output drivers. CMOS transistors may be employed, rather than bipolar transistors. Another advantage is that the interface circuitry and the method provide a reliable mechanism for test signal shaping at different voltage levels.

BEST MODE FOR CARRYING OUT THE INVENTION

Figure 2:
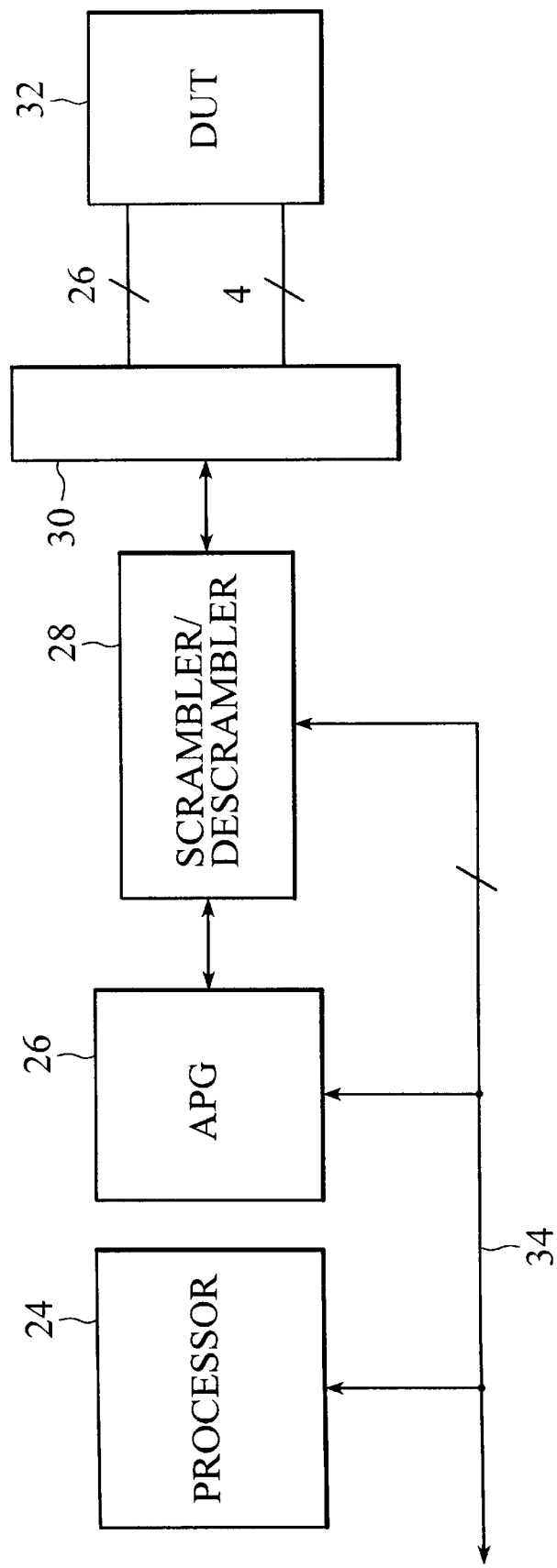
FIG. 2 is a block diagram of a test device having interface circuitry for coupling test signals to a device under test.

With reference to FIG. 2, a test device is shown as including a microprocessor core 24, an algorithmic program generator (APG) 26, a scrambler/descrambler 28 and an interface 30. The interface includes a number of interface circuits for coupling signals to and from a device under test (DUT) 32. The DUT is a semiconductor device. In the preferred embodiment, the DUT is a memory device, and is more preferably a high-speed DRAM. The interface to be described below allows testing at frequencies of greater than 500 MHz. Microcode is generated in a known manner and downloaded into the microprocessor core 24. The microcode is executed from the microprocessor core to generate and capture electrical signals for the testing of the DRAM 32.

In the embodiment of FIG. 2, the connection between the interface 30 and the DRAM 32 includes twenty-six address/data/control lines and four clock lines. However, the number of lines is not critical to the invention. The microprocessor core 24, the APG 26 and the scrambler/descrambler 28 are connected via a 32-bit address/data bus 34. The microprocessor core generates write requests and compare requests that are formatted at the APG. The operations of the scrambler/descrambler 28 are conventional and are known in the art. Address unscramble logic and data unscramble logic allow the test device to be used with different DUTs 32, since signal rerouting is enabled to accommodate DUTs having different mappings between logical and physical addresses and data.

Figure 1:
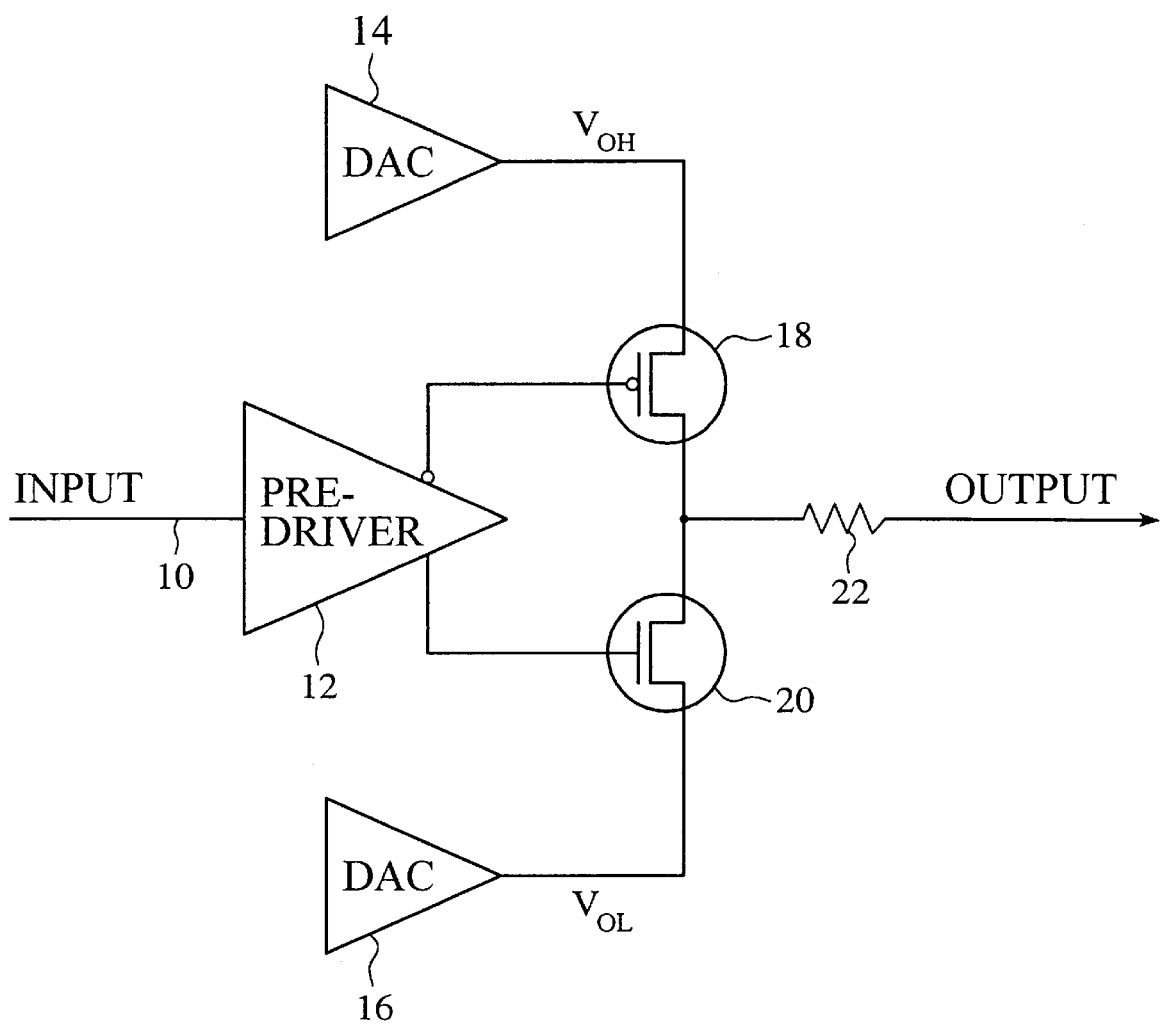
FIG. 1 is a schematical view of a prior art interface circuit of a test device.
Figure 3:
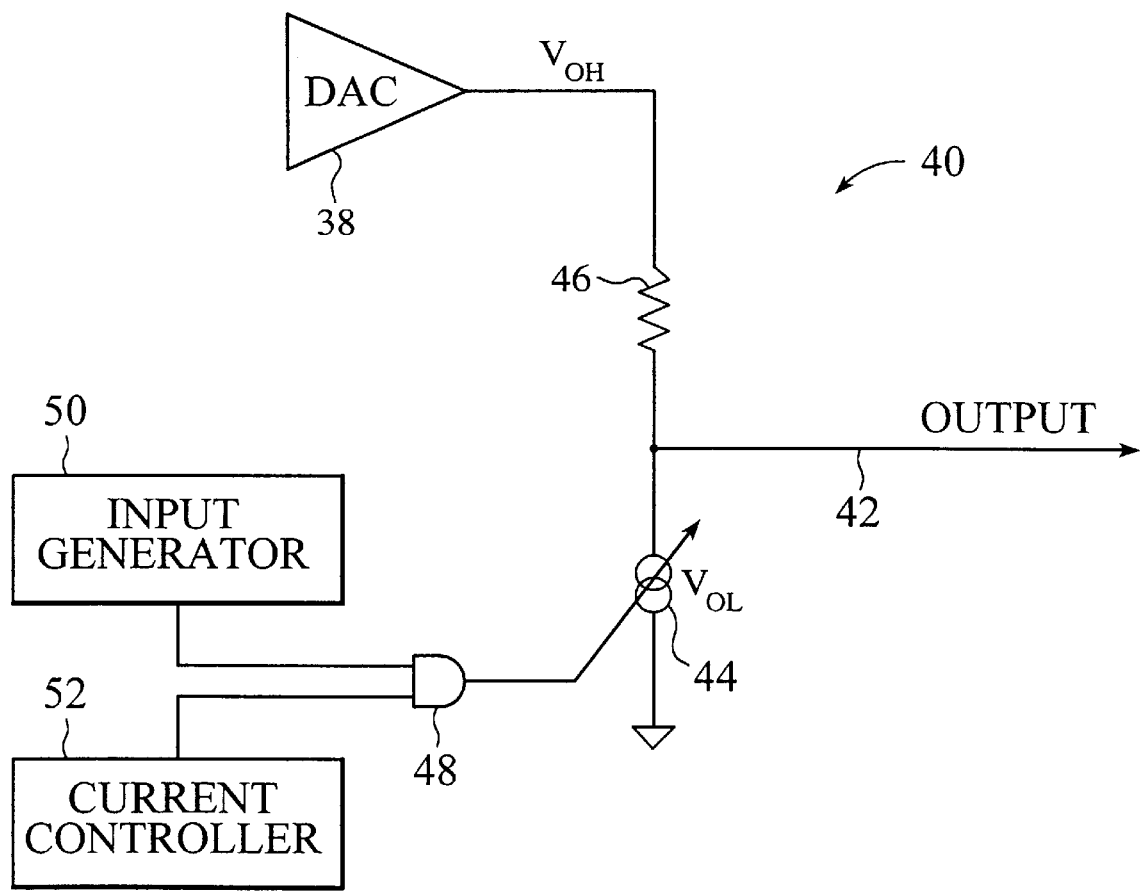
FIG. 3 is a schematical representation of one embodiment of an interface circuit for a test device using current mode signal shaping in accordance with the invention.

Each of the lines that couples the interface 30 to the DUT 32 is associated with a current mode driven interface circuit 36 that enables test signal waveform shaping about a range of voltages. As previously described with reference to FIG. 1, the conventional test signal waveform shaping is accomplished using a voltage mode driven interface circuit. One embodiment of a current mode driver output is shown in FIG. 3. The upper voltage level ($V_{OH}$) is defined by connection to a DAC 38. The DAC can be manipulated to provide a desired $V_{OH}$. For example, if the DUT 32 of FIG. 2 is a device that is designed to operate equally effectively within a range of 5 volts to 3.5 volts, the DAC 38 may be set as a source of 5 volts for a first testing sequence and then reset to 3.5 volts for a second testing sequence. Testing at intermediate voltages may also be easily achieved using the interface circuit 40 of FIG. 3. The DAC is not critical to the invention, since other sources may be used to accomplish the same function.

In the embodiment of FIG. 3, the $V_{OH}$ is the voltage level when an output signal along line 42 is "high." As will be explained more fully below, the voltage level when the output signal is "low" is determined by manipulation of a variable current source 44. The variable current source represents a number of parallel current paths. The current paths can be individually and selectively switched between "on" states and "off" states. The distribution of the current paths in the "on" state and current paths in the "off" state determines the voltage drop across a resistor 46 connecting the DAC 38 to the output line 42. If all of the paths are "off," the voltage level at the output line 42 will be equal to $V_{OH}$. Alternatively, if all of the paths are "on," the voltage level at the output line will be less than $V_{OH}$, but greater than 0 volts. For example, $V_{OH}$ may be approximately 2.5 volts, while the variable current source 44 may be set to provide a $V_{OL}$ of 1.9 volts. This achieves a voltage swing of approximately 0.6 volts, with $V_{OH}$ representing one logical state (e.g., 0) and $V_{OL}$ representing the other logical state (e.g., 1).

The variable current source 44 has two control inputs that are connected to an AND gate 48. A first control input is from an input generator 50 that provides the test signal to be coupled to the DUT via the output line 42. In FIG. 2, the input generator may be the combination of the APG 26 and the scrambler/descrambler 28. The second control input is the current controller 52. The current controller may be used to set the value of $V_{OL}$ for output of the test signal from the input generator 50. For example, in the embodiment in which the variable current source 44 represents parallel current paths, there may be a separate AND gate 48 for each current path. The signal from the input generator 50 may be common to all of the AND gates, while the signal from the current controller 52 individually addresses the AND gates to determine the distribution of "on" and "off" paths. If the current paths are electrically equivalent, the distribution of interest is merely a ratio of the current paths that are "on" to the paths that are "off." However, in the preferred embodiment, the current-determining characteristics are different for different paths.

In the embodiment of FIG. 2, there may be a single interface circuit 40 coupled to each of the twenty-six address/data/control lines extending between the interface 30 and the DUT 32. On the other hand, there may be a separate interface circuit for each voltage variable line. In fact, the interface 30 preferably includes a separate interface circuit 40 for each of the four clock lines. Thus, there will be at least five variable current sources 44. In operation, the current controllers 52 determine the value of $V_{OL}$, so that the test signal from the input generator 50 is output to the DUT via output line 42 at logical state voltage values of $V_{OH}$ and $V_{OL}$.

Figure 4:
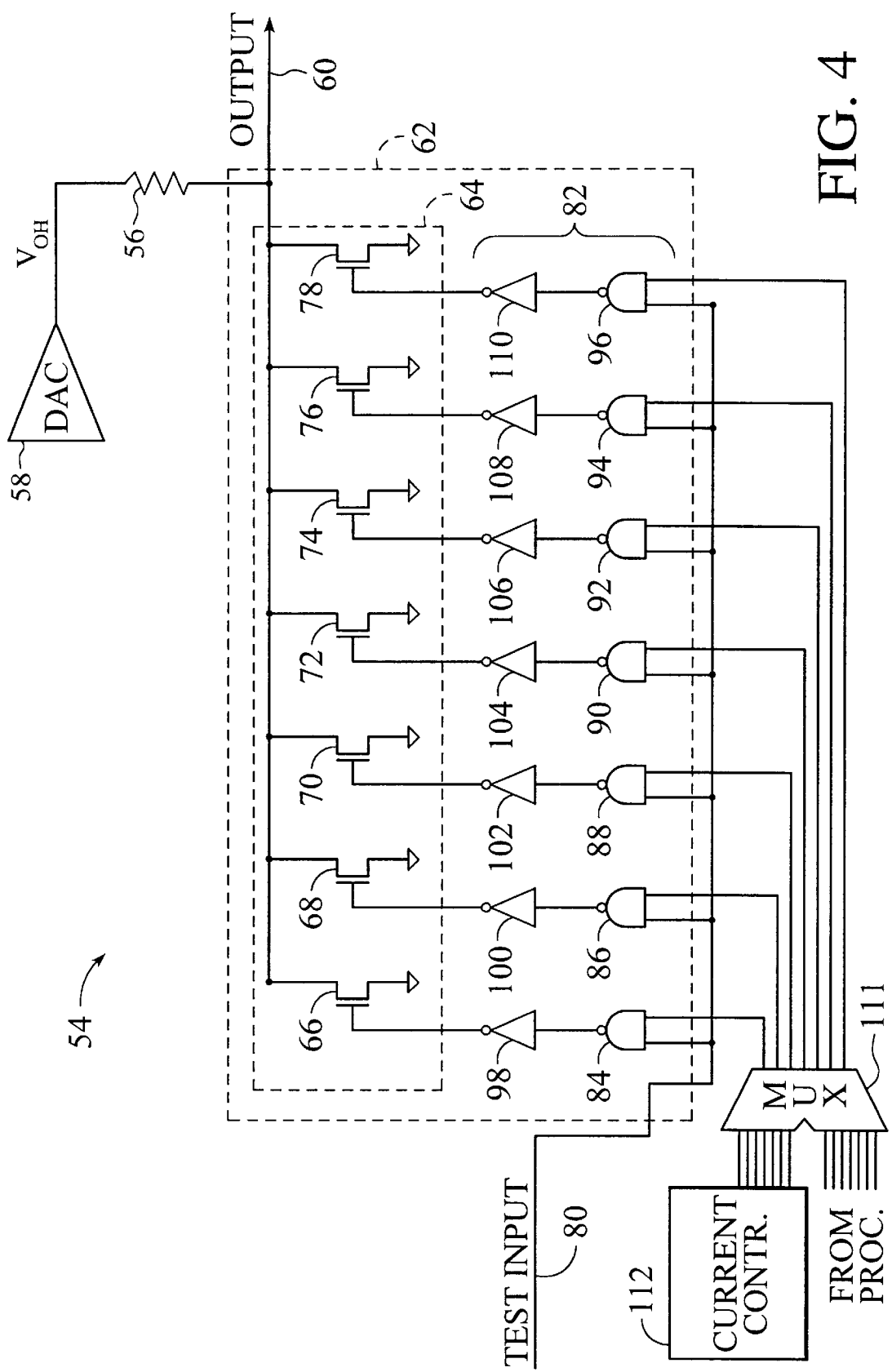
FIG. 4 is a schematical diagram of a more detailed embodiment of the interface circuit using current mode signal shaping for the test device of FIG. 2.

FIG. 4 illustrates a more detailed embodiment of the invention. The interface circuit 54 of FIG. 4 is similar to the bus output driver described in U.S. Pat. No. 5,254,883 to Horowitz et al., which is used to minimize current variations along the bus when there are variations in a power supply voltage, ambient temperature, and/or semiconductor processing. In FIG. 4, $V_{OH}$ is again determined by a voltage source and $V_{OL}$ is determined by a voltage drop across a resistor 56. The voltage source is shown as a DAC 58, but other devices may be used. For testing purposes, the source should permit a user to vary the supply voltage. In an alternative embodiment, the supply is fixed, but the resistor 56 is variable. The resistor 56 represents a resistive connection between the source of voltage and an output line 60. A physical resistor is not critical to the invention.

The interface circuit 54 includes a current mode driver 62. As in FIG. 3, when the current mode driver is in one state, there are no electrical paths to ground. In this state, the voltage level at the output line 60 will be $V_{OH}$, since there will be no voltage drop across the resistor 56. In the other state, at least one path to ground is established. Each ground path defines a separate current path. Pull-down current then flows through the resistor 56, causing the voltage drop across the resistor and lowering the voltage level at the output line 60. While the switchable current paths are described and illustrated as being "ground paths," this is not critical. The desired pull-down current will be available if the paths are to any voltage line sufficiently below $V_{OH}$.

The switchable current paths described with reference to FIG. 3 are formed by the transistor array 64 in FIG. 4. Each transistor 66, 68, 70, 72, 74, 76 and 78 provides a separate path between the output line 60 and electrical ground. Optionally, the transistors are structurally identical. However, in the preferred embodiment, the widths of the transistors are different. Since the transistors are N-channel MOS transistors, the widths affect the electrical properties of the transistors. The widths of the transistors may be governed by a binary relationship. That is, the width of a transistor may be twice as great as the width of the previous transistor in the array. Thus, if the width of the first transistor 66 is equal to x, the width of transistor 68 will be 2x, the width of the next transistor 70 will be 4x, and the width of the last transistor 78 in the array will be 64x.

The maximum current that the transistor array 64 can sink is $I_{MAX}$. In the embodiment in which the transistor widths are equal, each transistor 66–78 in the array contributes ⅐ of the $I_{MAX}$ current. On the other hand, in the embodiment in which the widths are x, 2x, 4x, 8x, 16x, 32x and 64x, respectively, the first transistor 66 contributes 1/127 of the $I_{MAX}$ current, the second transistor 68 contributes 2/127 of the $I_{MAX}$ current, the third transistor 70 contributes 4/127, etc. Thus, the selection of which transistors to switch "on" and "off" in response to a signal from a test input 80 will determine the pull-down current that results in the voltage drop across the resistor 56. In this manner, the lower voltage level $V_{OL}$ can be precisely set.

Referring briefly to FIG. 3, the AND gate 48 enables the input generator 50 and the current controller 52 to co-operatively control the variable current source 44. In FIG. 4, the AND logic function for control of each of the transistors 66–78 is accomplished using a NAND gate-inverter relationship. The current mode driver 62 includes an array 82 of paired NAND gates and inverters. The NAND gates are designated by reference numerals 84, 86, 88, 90, 92, 94 and 96. The inverters are designated by reference numerals 98, 100, 102, 104, 106, 108 and 110.

The NAND gates 84–96 have a common connection to the test input 80. Each NAND gate also has a connection to a MUX 111 that has a first set of inputs from a current controller 112 and a second set of inputs from the processor 24 of FIG. 2. The MUX may be an adder or any circuit that facilitates adjustment of the output of the current controller. The current controller can address the NAND gates independently. Each of the NAND gates and its associated inverter 98–110 control the switching of a transistor between an "on" state and an "off" state. In this manner, the logic circuitry that provides the AND logic function provides control of $V_{OL}$ for the test signal output at line 60. For example, when the test signal input along line 80 is a logical low, the signals from the inverters 98–110 will turn all of the transistors 66–78 "off." Consequently, the signal level at the output line 60 will be $V_{OH}$. In comparison, when the test signal at line 80 is a logical high, the "on" and "off" states of the transistors will depend upon the signals at the various lines connecting the MUX 111 to the NAND gates.

In one embodiment, the controller 112 outputs a 7-bit binary logic value to the MUX 111. The seven inputs from the processor to the MUX may be used to manipulate the logic value from the controller prior to application to the array of NAND gates 84–96. For example, if the current controller applies "0100000" to the first set of inputs and the processor applies "0100001" to the second set, a "1000001" binary logic value will be applied to the array 82. The first NAND gate 84 and the last NAND gate 96 will then output a logical low signal to inverters 98 and 110 when the test signal is logically high. Consequently, the first transistor 66 and the last transistor 78 will be switched "on." The remaining transistors will be in an "off" state. The first and last transistors provide current sinks for reducing the output voltage from $V_{OH}$ to $V_{OL}$. Then, when the test signal along line 80 returns to a logical low, all of the transistors 66–78 will be "off," returning the output signal at line 60 to $V_{OH}$.

In operation, the interface circuit 54 functions as a current mode output driver. The upper voltage level $V_{OH}$ is set at the DAC 58. The lower voltage level $V_{OL}$ is set by the logic value from the MUX 111, which determines which of the transistors 66–78 are "off" regardless of the state of the test signal input along line 80 and which of the transistors switch between "on" and "off" states in response to the test signal.

A testing sequence can be executed at first settings of $V_{OH}$ and $V_{OL}$. A second testing sequence may then be executed with one or both of the parameters adjusted to a different value. For example, $V_{OL}$ can be adjusted by varying the logic value to the second set of inputs to the MUX 111. In this manner, the integrated circuit under test may be evaluated at the extremes of voltage swings that the circuit is likely to encounter during use.

Figure 5:
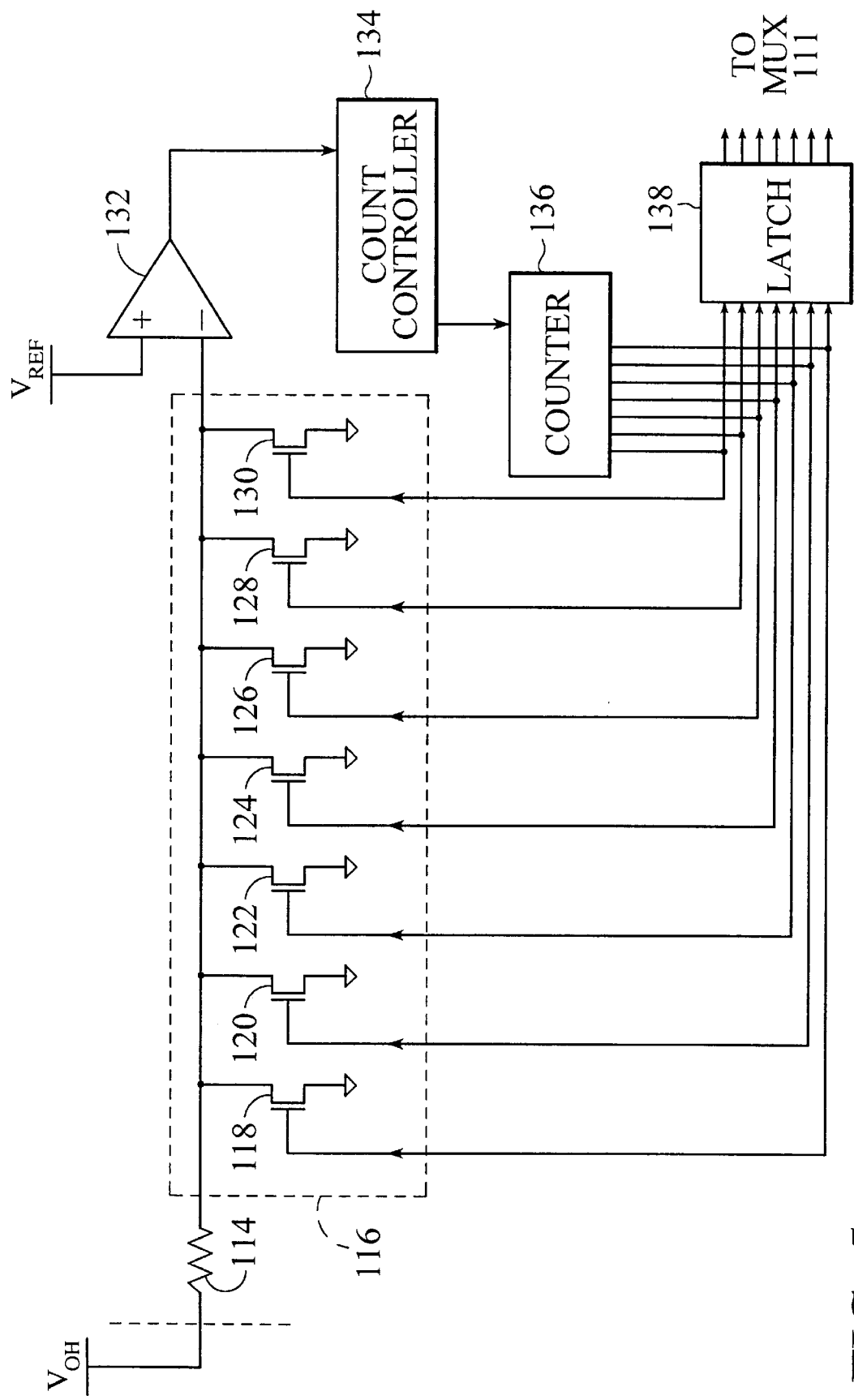
FIG. 5 is a schematical diagram of an exemplary embodiment of the current controller of FIG. 4.

FIG. 5 illustrates one embodiment of the current controller 112 of FIG. 4. However, the specific circuitry for executing the functions of the current controller is not critical. The current controller of FIG. 5 is a resistor reference embodiment of the controller. However, a capacitor reference controller may also be utilized.

A resistor 114 sets the value of the desired current. In one embodiment, the resistor has a resistance value five times greater than the value of the resistor 56 in FIG. 4. However, the value is user-selectable. A transistor array 116 is coupled to one end of the resistor 114. The transistor array corresponds to the transistor array 64 in FIG. 4. Preferably, both transistor arrays are formed on the same integrated circuit die. The significant difference between the transistor arrays is that the width of each transistor 118, 120, 122, 124, 126, 128 and 130 of the current controller is approximately 10% of that of the corresponding transistor 66–78 of the transistor array 64. The 10:1 scaling reduces power consumption inside the current controller 112. Additionally, the scaling allows the size of the transistor array 116 to be reduced. The resistance of the transistor array 116 divided by the resistance of the resistor 114 yields a quotient that is twice the quotient produced by dividing the resistance of the transistor array 64 by the resistance of resistor 56. Thus, the controller resistor 114 and the controller transistor array 116 form a 2:1 scaling factor in comparison with the interface circuit resistor 56 and interface circuit transistor array 64. However, the widths of the transistors 118–130 as compared to the widths of transistors 66–78 are not critical.

A comparator 132 is connected to the resistor 114. The comparator is also connected to a reference voltage ($V_{REF}$). The comparator provides an input to a count controller 134 that manages a counter 136. The count controller initializes, starts and stops the counter, which provides inputs to the MUX 111 of FIG. 4. A latch 138 is located between the counter and the inputs of the MUX.

In addition to providing the inputs to the MUX 111, the counter 136 is coupled to the gates of the controller transistors 118–130 to individually and separately control the "on" and "off" states of the transistors. The counter provides a binary output. When the counter reaches a final count of "1000001," controller transistors 118 and 130 are turned "on" and the remaining controller transistors are turned "off."

When the counter 136 has an output of "0000000," all of the controller transistors 118–130 are turned "off." In this condition, there is no voltage drop across the resistor 114. However, when the counter counts to "0000001," the controller transistor 118 turns "on" and there is a voltage drop across the resistor 114 as current flows through the transistor 118. The reduced voltage at the input of the comparator 132 is compared to $V_{REF}$ to determine if the voltage has gone below the $V_{REF}$ voltage level. If so, the comparator and the count controller 134 cooperate to stop the counting by the counter 136. If not, the counter is allowed to continue its count. The continuation will cause the first transistor 118 to turn "off" and the second transistor 120 to turn "on." In the embodiment in which the transistors 118–130 have different electrical characteristics, the voltage drop across the resistor 114 will be greater when the second transistor is "on." Again, a comparison is executed at the comparator 132 to determine if the counter 136 is to continue counting.

The operation of the counter 136 will be terminated when the voltage drop across the resistor 114 causes the affected input to the comparator 132 to exceed the $V_{REF}$ level. The output of the comparator then flips. The final count is latched by the latch 138, which couples the count to the first set of inputs to the MUX 111.

Referring to FIGS. 4 and 5, the binary logic value from the current controller 112 to the MUX 111 may be used to set a midpoint for $V_{OL}$, with the second set of inputs to the MUX being used to positively or negatively vary $V_{OL}$ from the midpoint. The midpoint voltage may be 0.5 volts when the processor provides a binary logic value of "0000000." When the logic value from the processor is positive, $V_{OL}$ will exceed 0.5 volts. On the other hand, when the binary logic value from the processor is negative, $V_{OL}$ will be below 0.5 volts.

The MUX 111 is included to facilitate adjustment of $V_{OL}$ during a testing sequence. In practice, the MUX is a component of the current controller 112. The function of the MUX may be replaced by an adder or equivalent logic block. However, the operation of the MUX or equivalent circuit is not critical to the invention. Adjustment of $V_{OL}$ may be achieved by varying the $V_{REF}$ input to the comparator 132 of FIG. 5. Other mechanisms for varying $V_{OL}$ may also be utilized.

Figure 6:
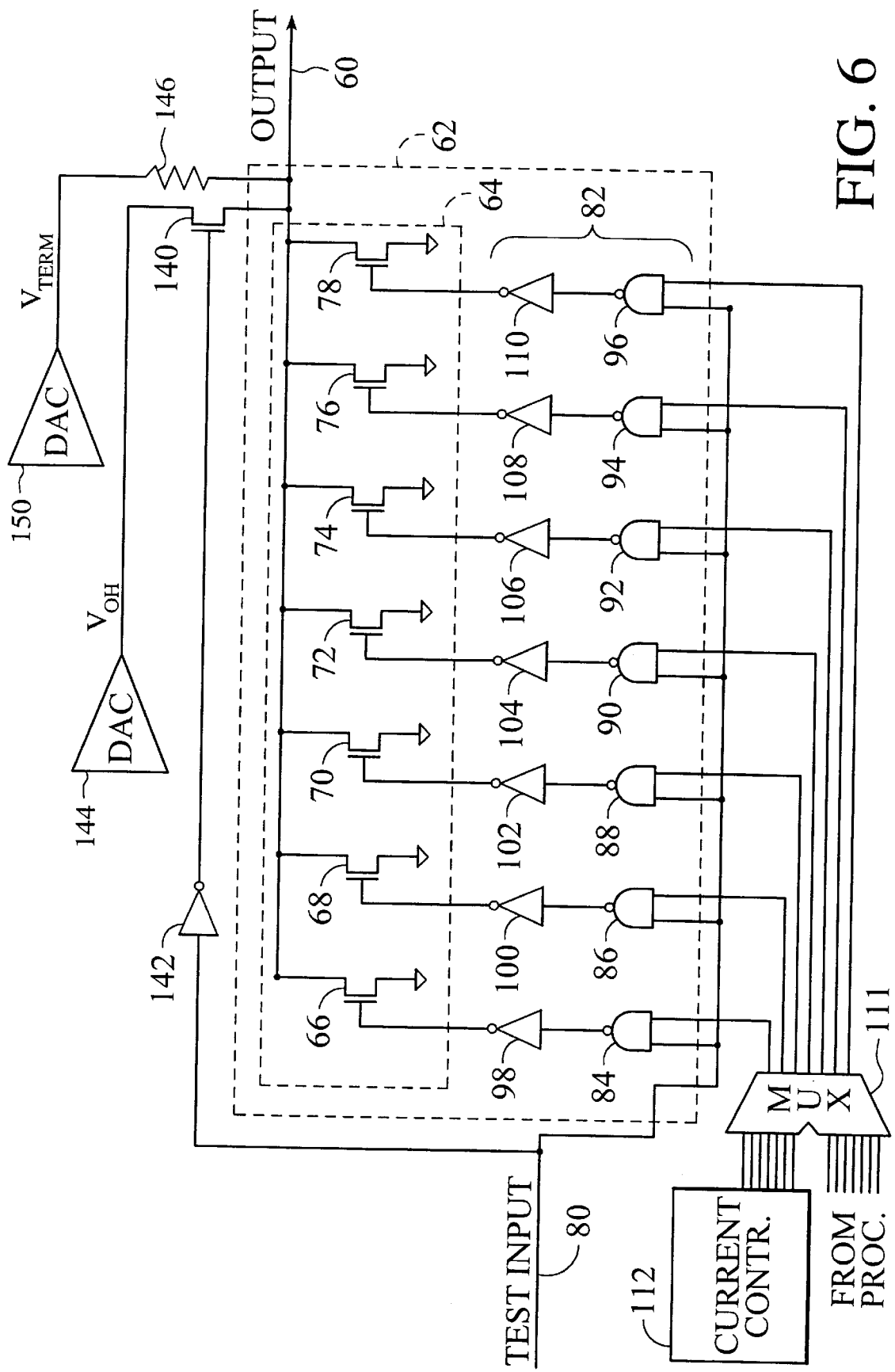
FIG. 6 is a schematical diagram of another embodiment of an interface circuit in accordance with the invention.

In the embodiment of FIG. 4, there is a relationship between $V_{OH}$ and $V_{OL}$, since an adjustment of $V_{OH}$ will adjust $V_{OL}$. On the other hand, the embodiment of FIG. 6 allows some isolation of the adjustments of $V_{OH}$ and $V_{OL}$. There are advantages to this isolation in some applications, e.g., to reduce reflection. In order to simplify explanation of the circuitry of FIG. 6, the components that are electrically and functionally identical to the components of the embodiment of FIG. 4 have identical reference numerals. In FIG. 6, the switching of a transistor 140 between an "on" state to an "off" state is controlled by a connection to the test input line 80 via an inverter 142. When the test input line is at a logical low, the transistor 140 will be "on," while all of the seven transistors 66–78 will be "off." Since the transistor 140 is connected between a source (DAC) 144 of $V_{OH}$ and the output line 60, the voltage at the output line will be affected by the setting of $V_{OH}$. Alternatively, when the test input line is switched to a logical high, the transistor 140 will be turned "off," and the output line will no longer be connected to $V_{OH}$. The states of the transistors 66–78 will depend upon the binary logical value from the MUX 111, as described with reference to FIGS. 4 and 5. The distribution of transistors 66–78 that are "on" will determine the value of $V_{OL}$ by operation of the induced voltage drop across a resistor 146 that is connected to a source (DAC) 150 of a termination voltage $V_{TERM}$. The resistor 146 and source 150 serve the same functions as the resistor 56 and DAC 58 in the embodiment of FIG. 4.

From a fabrication perspective, an advantage of the embodiment of FIG. 6 is that the transistor 140 and the inverter 142 may be integrated onto the same chip as the current mode driver 62, the MUX 111 and the current controller 112. Thus, only the DAC 58 is not integrated. On the other hand, the resistor 56 of FIG. 4 is not integrated with the current mode driver, MUX or current controller.

We claim:

1. Interface circuitry of a test device for an integrated circuit comprising:

an output line for connection to an integrated circuit under test;

a current mode driver having a plurality of transistors connected to form parallel switchable current paths, said transistors being coupled to said output line, said current mode driver having first and second input means in electrical communication with said transistors for selectively switching said transistors between "on" states and "off" states;

a controller connected to said first input means for individually addressing said transistors; and signal means connected to said second input means for providing a test signal to control said transistors.

2. The interface circuitry of claim 1 further comprising a generally fixed resistance connection between said output line and a source of a desired high voltage, said transistors being connected between said output line and a fixed low voltage line to selectively establish electrical paths from said source to said fixed low voltage line.

3. The interface circuitry of claim 2 wherein said source establishes a substantially fixed high voltage at a side of said generally fixed resistance connection opposite to said transistors.

4. The interface circuitry of claim 1 further comprising an active switching connection between said output line and a source of a desired high voltage, said active switching connection being linked to said signal means such that said active switching connection is switched to an "off" state when said transistors are switched to said "on" states.

5. The interface circuitry of claim 1 wherein said first and second input means are integrated into a logic circuit connected to gates of said transistors, said transistors being MOS transistors.

6. The interface circuitry of claim 5 wherein said logic circuit executes a plurality of AND logic functions having a one-to-one correspondence with said MOS transistors, said controller having a plurality of current control lines connected to provide a separately addressable first input for each said AND logic function, said signal means being connected to provide a second input for each said AND logic function.

7. The interface circuitry of claim 1 wherein said signal means includes an Algorithmic Pattern Generator (APG).

8. The interface circuitry of claim 1 wherein said output line is connected to a pad of said integrated circuit under test and wherein said signal means provides test signals for one of a clock input or a data line.

9. The interface circuitry of claim 1 further comprising an array of said current mode drivers, with each current mode driver being connected to a specific pad of said integrated circuit under test.

10. The interface circuitry of claim 9 wherein said current mode drivers are connected to a random access memory (RAM) device, said RAM device being said integrated circuit under test.

11. The interface circuitry of claim 1 wherein said controller is connected to said first input means of said current mode driver via circuitry means for selectively adjusting a binary logic value output from said controller to determine a distribution of which of said transistors will switch states in response to said first input means.

12. A test device for an integrated circuit, said test device having an array of interface circuits for connection to an array of input/output lines of said integrated circuit under test, each interface circuit comprising:
   a source of an upper voltage level;
   resistor means having a first end connected to said source and having a second end;
   an output line connected to said second end for connection to one of said input/output lines;
   a plurality of parallel switchable current paths from said second end of said resistor means to a line having a lower voltage level than said upper voltage level, each current path having an "on" state and an "off" state; and
   logic circuitry coupled to said current paths to individually and selectively switch said current paths between said "on" state and "off" state such that a voltage drop across said resistor means is dependent upon the distribution of current paths in said "on" and "off" states, said logic circuitry having a common input to receive a test signal, said logic circuitry having a plurality of current control inputs having a one-to-one correspondence with said current paths,
   wherein for each of said current paths, said switching is responsive to a co-operation between a signal level at said common input and signal level at said current control input corresponding to said each current path.

13. The test device of claim 12 wherein each current path includes a MOS transistor connecting said second end of said resistor means to a fixed low voltage line, each MOS transistor having a gate connected to said logic circuitry.

14. The test device of claim 13 wherein said logic circuitry defines an AND logic function for each input to each gate of said MOS transistors, said AND logic function being responsive to said signal levels at said common input and said corresponding current control input.

15. The test device of claim 12 further comprising a test signal generator connected to said common input of said logic circuitry, said interface circuits being connected to a RAM device.

16. A method of selectively inputting a test signal to an input/output line of an integrated circuit under test comprising steps of:
   connecting a plurality of transistors from a test output line to a fixed low voltage;
   connecting said test output line to a path to a source of a substantially fixed voltage, said path being one of a passive resistive path or an active path;
   connecting said test output line to said input/output line;
   selectively switching said transistors between "off" states and "on" states, thereby determining a voltage drop across said path between said output line and said source, said switching being responsive to a co-operation of inputs to logic circuitry controlling said transistors;
   connecting said test signal as one of said inputs to said logic circuitry such that said test signal is co-operatively associated with switching each of said transistors; and
   connecting a plurality of control signals to said logic circuitry such that each control signal is a second input that is co-operatively associated with switching individual transistors, said control signals having a one-to-one correspondence with said transistors.

17. The method of claim 16 wherein said step of selectively switching said transistors includes controlling a gate input to each transistor as an AND gate function of said test signal and said control signal corresponding to said each transistor.

18. The method of claim 16 further comprising connecting said test output line to said input/output line of a random access memory (RAM) device under test.

19. The method of claim 18 wherein said step of connecting said test signal includes generating one of a clock signal or a data signal.

20. The method of claim 16 wherein said step of connecting said control signals includes forming said control signals to individually address said switching of said transistors, said test signal being common to said switching of said transistors.

21. The method of claim 16 wherein said step of connecting said test output line to said path is a step of connecting a resistor between said test output line and said substantially fixed voltage.

22. The method of claim 16 wherein said step of connecting said test output line to said path is a step of connecting a switching transistor between said test output line and said substantially fixed voltage such that said switching transistor is turned "off" when at least one of said plurality of transistors is turned "on."

* * * * *